United States Patent [19]

Kobashi et al.

[11] Patent Number: 5,761,141
[45] Date of Patent: Jun. 2, 1998

[54] SEMICONDUCTOR MEMORY DEVICE AND TEST METHOD THEREFOR

[75] Inventors: Hisao Kobashi; Yasuhiko Tsukikawa, both of Hyogo, Japan

[73] Assignee: Mitsubishi Denki Kabushiki Kaisha, Tokyo, Japan

[21] Appl. No.: 782,038

[22] Filed: Jan. 13, 1997

[30] Foreign Application Priority Data

Sep. 24, 1996 [JP] Japan .................. 8-251738

[51] Int. Cl.$^6$ .................................. G11C 7/00
[52] U.S. Cl. .................. 365/201; 365/200; 365/203
[58] Field of Search .................... 365/200, 149, 365/190, 189.01, 201, 203

[56] References Cited

U.S. PATENT DOCUMENTS 5,079,743   1/1992   Suwa et al. .................. 365/149

FOREIGN PATENT DOCUMENTS 61-216199   9/1988   Japan .

Primary Examiner—Joseph A. Popek
Attorney, Agent, or Firm—Lowe, Price, LeBlanc & Becker

[57] ABSTRACT

A switching circuit for switching a bit line potential VBL of a DRAM to a power supply potential Vcc, an intermediate potential Vcc/2 or the ground potential GND is provided. In normal operation, the bit line potential VBL is set to Vcc/2. In a special write mode, Vcc or GND is applied to all the bit lines through an equalizer, a desired word line is raised to "H" level, and Vcc or GND is written to the storage nodes of all the memory cells connected to the word line. It is possible to write Vcc or GND even to the storage node of a memory cell which has been replaced by a redundant memory cell.

4 Claims, 6 Drawing Sheets

5,761,141

1

SEMICONDUCTOR MEMORY DEVICE AND TEST METHOD THEREFOR

BACKGROUND OF THE INVENTION

1. Field of the Invention

The present invention relates to a semiconductor memory device and test method therefor, and more specifically, it relates to a semiconductor memory device having a special write mode and test method therefor.

2. Description of the Background Art

FIG. 4 is a block diagram showing a structure of a conventional dynamic random access memory (hereinafter referred to as a DRAM). Referring to FIG. 4, the DRAM includes control signal input terminals 11 to 13 and 15, an address signal input terminal group 14, a data signal input/output terminal group 16, a ground terminal 17 and a power supply terminal 18. Further, the DRAM includes a clock generating circuit 19, a row and column address buffer 20, a row decoder 21, a column decoder 22, a redundant column decoder 23, a memory mat 24, an input buffer 28 and an output buffer 29, and memory mat 24 includes a memory array 25, a redundant memory array 26 and a sense refresh amplifier + input/output control circuit 27.

Clock generating circuit 19 selects a prescribed operation mode based on externally applied signals /RAS and /CAS applied externally through control signal input terminals 11 and 12, and controls overall operation of the DRAM.

Row and column address buffer 20 generates row address signals RA0 to Rai and column address signals CA0 to Cai based on address signals A0 to Ai (where i is a natural number) externally applied through address signal input terminal group 14, and applies the generated signals RA0 to Rai and CA0 to Cai to row decoder 21 and column decoder 22, respectively.

Memory array 24 includes a plurality of memory cells each storing 1 bit of data. Each memory cell is arranged at a prescribed address determined by the row and column addresses.

Row decoder 21 designates a row address of memory array 25 in response to row address signals RA0 to Rai applied from row and column address buffer 20. Column decoder 22 designates a column address of memory array 25 in response to column address signals CA0 to Cai applied from row and column address buffer 20.

In column decoder 22 and redundant column decoder 23, there is provided a fuse group (not shown) for programming a column address which includes a defective memory cell in memory array 25 and a column address of redundant memory array 26 which is to be substituted for the defective column address. When column address signals CA0 to Cai corresponding to the defective column address programmed by the fuse group are input, column decoder 22 does not designate the column address but designates the column address of the redundant memory array 26 programmed in place of the column address. More specifically, the defective memory cell column including a defective memory cell of memory array 24 is replaced by a normal memory cell column of redundant memory array 26.

Sense refresh amplifier + input/output control circuit 27 connects a memory cell of the address designated by row decoder 21 and column decoder 22 (or redundant column decoder 23) to one end of the data signal input/output line pair IOP. The other end of data signal input/output line pair IOP is connected to input buffer 27 and output buffer 28. Input buffer 28 applies data input from data signal input/

2 output terminal group 16 to the memory cell selected through the data signal input/output terminal pair IOP, in response to a signal /W applied externally through control signal input terminal 13, in a write mode. Output buffer 29 outputs data read from the selected memory cell to data input/output terminal group 16, in response to a signal /OE input from control signal input terminal 15, in a read mode.

FIG. 5 is a partially omitted circuit block diagram showing the structure of memory mat 24 of the DRAM shown in FIG. 4, and FIG. 6 is a partially omitted circuit block diagram showing, in detail, a structure of one column in the memory mat 24 shown in FIG. 5.

Referring to FIGS. 5 and 6, memory array 25 includes a plurality of memory cells MC arranged in a matrix, word lines WL provided corresponding to respective rows, and bit line pairs BL, /BL provided corresponding to respective columns.

Each memory cell MC is connected to word line WL of the corresponding row. A plurality of memory cells MC of odd numbered columns are connected to bit line BL or /BL alternately. A plurality of memory cells MC of even numbered columns are connected to bit lines /BL or BL alternately.

Each memory cell MC includes an N channel MOS transistor 50 for accessing, and a capacitor 51 for storing information. The N channel MOS transistor 50 of each memory cell MC has its gate connected to the word line WL of the corresponding row. N channel MOS transistor 50 is connected between the bit line BL or /BL of the corresponding column and one electrode (storage node SN) of capacitor 51 of the memory cell MC. The other electrode of capacitor 51 of each memory cell MC receives a cell potential Vcp. The word line WL transmits an output from row decoder 20, and activates the memory cells MC of the selected row. Bit line pair BL, /BL performs input/output of data signal to and from the selected memory cell MC.

Redundant memory array 26 has the same structure as memory array 25 except that the member of columns is smaller than in memory array 25. Memory array 25 and redundant memory array 26 have the same number of rows, and word lines WL are shared by memory array 25 and redundant memory array 26.

Sense refresh amplifier + input/output control circuit 27 includes a column selection gate 31, a sense refresh amplifier 32 and an equalizer 33 provided corresponding to respective columns, and an intermediate potential generating 34 provided common to all the columns. Column selection gate 31 includes N channel MOS transistors 41 and 42 connected between bit lines BL, /BL and data signal input/output lines IO, /IO, respectively. N channel MOS transistors 41 and 42 have their gates connected to column decoder 22 or 23 through column selection line CSL. When column selection line CSL is raised to the selected level of "H" by column decoder 22 or 23, N channel MOS transistors 41 and 42 are rendered conductive, whereby bit line pair BL, /BL is coupled to data signal input/output line pair IO, /IO.

Sense refresh amplifier 32 includes P channel MOS transistors 43 and 44 connected between bit lines BL, /BL and a node N32, and N channel MOS transistors 45 and 46 connected between bit lines BL, /BL and a node N32'. MOS transistors 43 and 45 both have their gates connected to bit line /BL, and MOS transistors 44 and 46 have their gates both connected to bit line BL. Nodes N32 and N32' receive sense amplifier activating signals SE and /SE output from clock generating circuit 19, respectively. Sense refresh amplifier 32 amplifies a small potential difference between the bit line pair BL and /BL to power supply voltage Vcc, in response to sense amplifier activating signals SE and /SE attaining "H" and "L" levels, respectively.

Equalizer 33 includes an N channel MOS transistor 47 connected between bit lines BL and /BL, and N channel MOS transistors 48 and 49 connected between bit lines BL, /BL and a node N33', respectively. N channel MOS transistors 47 to 49 have their gates connected to node N33. Node N33 receives a bit line equalizing signal BLEQ, and node N33' receives a bit line potential VBL (=Vcc/2). Equalizer 33 equalizes the potentials of bit lines BL and /BL to bit line potential VBL in response to the bit line equalizing signal BLEQ attaining to the active level of "H" level.

Intermediate potential generating circuit 34 generates an intermediate potential Vcc/2 between power supply potential Vcc and ground potential GND, and outputs the generated intermediate potential Vcc/2 as bit line potential VBL.

The operation of the DRAM shown in FIGS. 4 to 6 will be described briefly. In a write mode, column decoder 22 or 23 raises column selection line CSL of the column which corresponds to the column address signals CA0 to Cai to the active level of "H", so as to render conductive column selection gate 31.

Input buffer 28 applies write data from data signal input/output terminal group 16 to the bit line pair BL, /BL of the selected column through data signal input/output terminal pair IOP, in response to the signals /WE. Write data is applied as a potential difference between bit lines BL and /BL. Thereafter, row decoder 21 raises the word line WL of the row which corresponds to the row address signals RA0 to Rai to the active level of "H", so as to render conductive the MOS transistor 50 of the memory cells MC of that row. Charges corresponding to the potential of bit line BL or /BL are stored in the capacitor 51 of the selected memory cell MC.

In the read mode, referring to FIG. 7, first the bit line equalizing signal BLEQ falls to the "L" level, N channel MOS transistors 47 to 49 of equalizer 33 are rendered non-conductive and equalization between bit lines BL and /BL is stopped. Row decoder 21 raises the potential of the word line WL of the row corresponding to the row address signals RA0 to Rai to the selected level of "H". The potential of bit lines BL and /BL change slightly in accordance with the amount of charges in capacitor 51 of the activated memory cell MC. Thereafter, sense amplifier activating signals SE and /SE attain to the "H" level and "L" level, respectively, and sense refresh amplifier 32 is activated. When the potential of bit line BL is slightly higher than the potential of bit line /BL, the resistance values of MOS transistors 43 and 46 become smaller than the resistance values of MOS transistors 44 and 45, so that the potential of bit line BL is pulled up to "H" level, while the potential of bit line /BL is pulled down to the "L" level. Conversely, when the potential of bit line /BL is slightly higher than the potential of bit line BL, resistance values of transistors 44 and 45 become smaller than the resistance values of MOS transistors 43 and 46, so that the potential of bit line /BL is pulled up to the "H" level and the potential of bit line BL is pulled down to the "L" level.

Thereafter, column decoder 22 or 23 raises the column selection line CSL of the column corresponding to the column address signals CA0 to Cai to the selected level of "H" so as to render the column selection gate 31 of that column conductive. The data of the bit line pair BL, /BL of the selected column is applied to output buffer 29 through column selection gate 31 and data signal input/output line pair IO, /IO. Output buffer 26 outputs the read data to data signal input/output terminal group 16 in response to the signal /OE.

When column address signals CA0 to Cai correspond to the column including a defective memory cell MC, a column of redundant memory array 26 is selected instead of the column including the defective memory cell MC, and writing and reading operations are performed in the similar manner.

Now, in such a DRAM, dependent on the state of defective memory cell MC, normal memory cells MC thereabout may possibly malfunction, affected by the defective memory cell MC, even when the defective memory cell MC is replaced by the redundant memory cell MC.

More specifically, referring to FIG. 8, a DRAM is formed at a surface of a p type silicon substrate 52. A gate electrode, that is, word line WL is formed above the surface of p type silicon substrate 52 with a gate oxide film (not shown) interposed, and $n^+$ source/drain regions 53 are formed at the surface of silicon substrate 2 on both sides of word line WL, whereby an N channel MOS transistor 50 of the memory cell MC is completed. One of the source/drain regions 53 of N channel MOS transistor 50 is connected to bit line BL, and on the surface of the other, a conductive layer 54, a dielectric layer 55 and a conductive layer 56 are stacked, providing capacitor 51 of the memory cell MC. Conductive layer 54 serves as one electrode, that is, storage node SN of capacitor 51, and conductive layer 56 serves as the other electrode of capacitor 51. In the figure, three memory cells MC1 to MC3 are shown.

Now, assume that a small conductive foreign matter exist between the gate electrode, that is, word line WL2 of the central memory cell MC2, and silicon substrate 52. Further, it is assumed that the foreign matter is small enough to allow data writing to the memory cell MC2, which is defective, and that word line WL2 is driven normally.

When "L" level is written to storage node SN of defective memory cell MC2, "H" level is written to storage node SN of normal memory cell MC1 and word line WL2 corresponding to memory cell MC2 is raised to the "H" level, then positive charges (holes) are introduced from word line WL2 to silicon substrate 52 through the foreign matter. By the positive charges, silicon substrate 52 locally comes to have positive potential, and a pn junction between the portion having the positive potential and the storage node SN of memory cell MC2 is forward biased. Accordingly, negative charges (electrons) flow from the storage node SN at the "L" level to silicon substrate 52. The negative charges move to the storage node SN at the "H" level of the adjacent memory cell MC1, possibly lowering the potential of storage node SN to "L" level.

Therefore, even when such a defective memory cell MC is replaced by a normal memory cell MC of redundant memory array 26, memory cells MC around the defective memory cell MC malfunction, and the DRAM as a whole does not operate normally.

Accordingly, it becomes necessary to perform the following test before delivery of each DRAM. More specifically, "L" level is written to the storage node SN of the defective memory cell MC and "H" level is written to the storage node SN of other normal memory cells MC. A word line WL corresponding to the defective memory cell MC is raised to the "H" level and data of normal memory cells MC are read. As a result, when the level of the storage node SN of the normal memory cells MC is the original "H" level, it is determined that the DRAM is operating normally, while if the storage node SN of the normal memory cells MC is inverted to the "L" level, it is determined that the DRAM is defective.

However, in the conventional DRAM, the defective memory cell MC which has been replaced by redundant memory cell MC cannot be accessed. Therefore, it is impossible to write the "L" level to the storage node SN of the replaced defective memory cell MC.

Further, as shown in FIG. 5, since a plurality of memory cells MC of each column are connected alternately to bit lines BL and /BL, when the same logic level is to be written to the storage nodes SN of respective memory cells MC, it is necessary to switch the logic levels to be applied to bit lines BL and /BL according to the addresses of respective memory cells MC, and therefore writing of the logic level to the storage nodes SN of the memory cells MC is not easy. Especially when the defective memory cell MC is replaced by a redundant memory cell MC, there are cases where the defective memory cell MC connected to the bit line BL is replaced by a redundant memory cell MC connected to bit line BL' and where it is replaced by the redundant memory cell MC connected to bit lines /BL'. This means that writing of logic level to the storage node SN of the redundant memory cell MC is further complicated.

SUMMARY OF THE INVENTION

Therefore, an object of the present invention is to provide a semiconductor memory device which allows easy and quick writing of logic potential to the storage node of a memory cell and test method therefor. Briefly stated, in the semiconductor memory device of the present invention, first or second logic potential is applied to all the bit lines through an equalizer, thereafter a word line is raised so that the first or second logic potential is simultaneously written to the storage nodes of the memory cells corresponding to the word line. Therefore, no matter which one of the bit lines the memory cell is connected or no matter whether the memory cell is replaced by a redundant memory cell, the first or the second logic potential can be written simultaneously to the storage nodes of all the memory cells corresponding to the selected word line. Therefore, writing of the logic potential to the storage nodes of memory cells can be performed readily and quickly.

Preferably, the equalizer also serves as an equalizer for reading which have been conventionally provided in the semiconductor memory device. Therefore, the structure is simple and not made complicated.

Briefly stated, in the test method of the semiconductor memory device in accordance with the present invention, a first logic potential is applied to all the bit lines through an equalizer, and a word line corresponding to a defective memory cell is kept at a selected potential for a prescribed time period so as to write the first logic potential to the storage node of the defective memory cell, and the second logic potential is written to the storage nodes of normal memory cells other than the defective memory cell. Then, the word line corresponding to the defective memory cell is kept at the selected potential for a prescribed time period and thereafter, potentials of storage nodes of normal memory cells are read, whereby presence/absence of malfunction is determined based on the result of reading. Accordingly, the logic potential can be easily written to the storage node of the defective memory cell which has been replaced by a redundant memory cell, and presence/absence of malfunction derived from the defective memory cell can be readily tested.

Preferably, a second logic potential is applied to all the bit lines through the equalizer, each of the word lines other than the word line corresponding to the defective memory cell are kept at a selected potential for a prescribed time period, and the second logic potential is applied to the storage nodes of the normal memory cells other than the defective memory cell. Therefore, the second logic potential can be written to the storage nodes of normal memory cells readily and quickly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
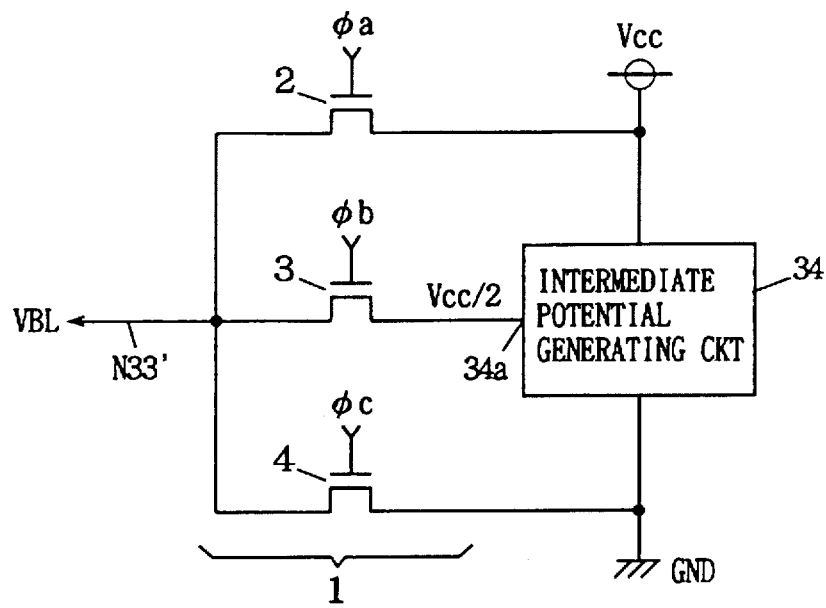
FIG. 1 is a circuit block diagram showing a structure of a main portion of a DRAM in accordance with one embodiment of the present invention.

FIG. 1 is a circuit block diagram showing a structure of a m ain portion of the DRAM in accordance with the present invention.

Figure 5:
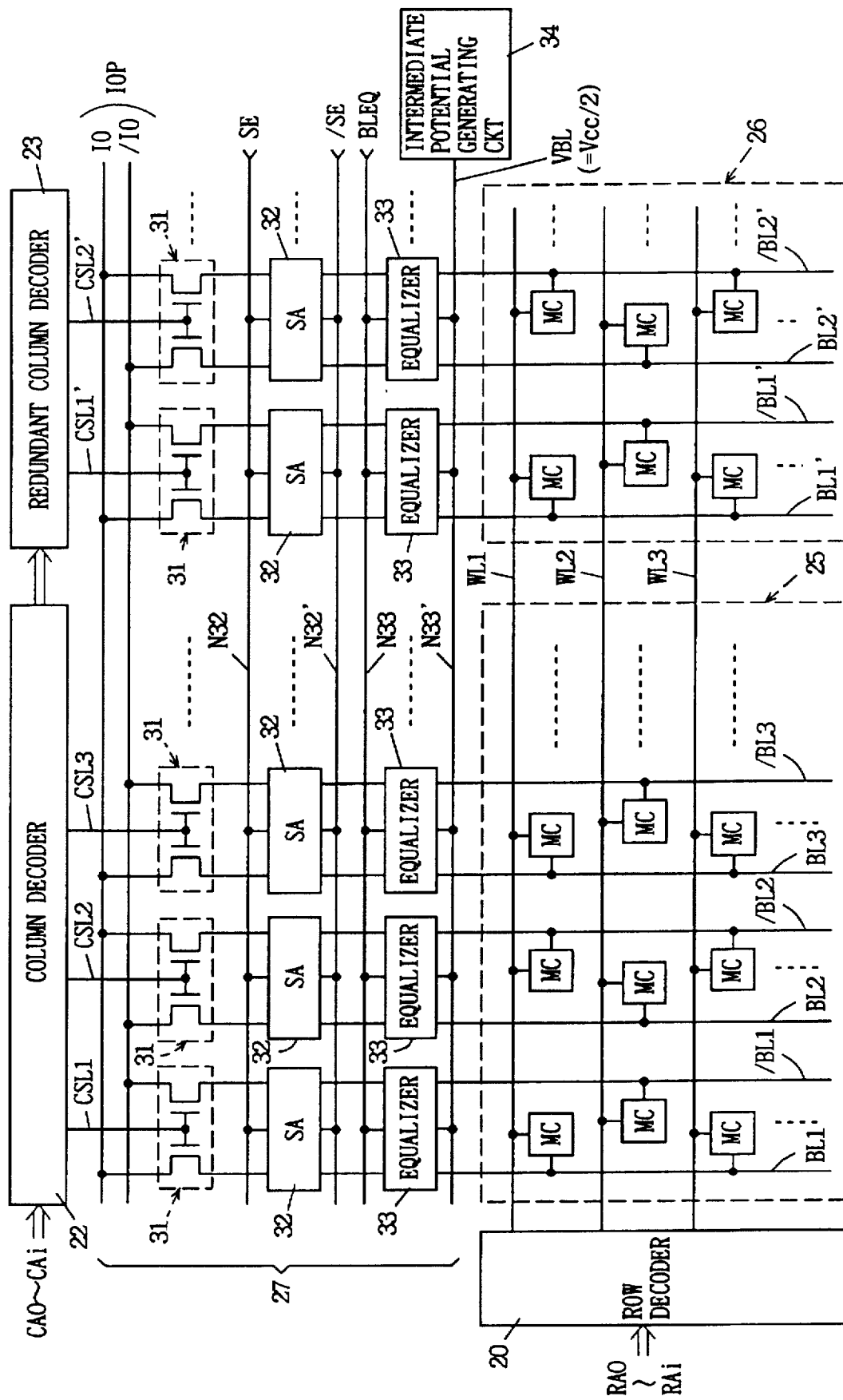
FIG. 5 is a partially omitted circuit block diagram showing a structure of a memory mat of the DRAM shown in FIG. 4.
Figure 6:
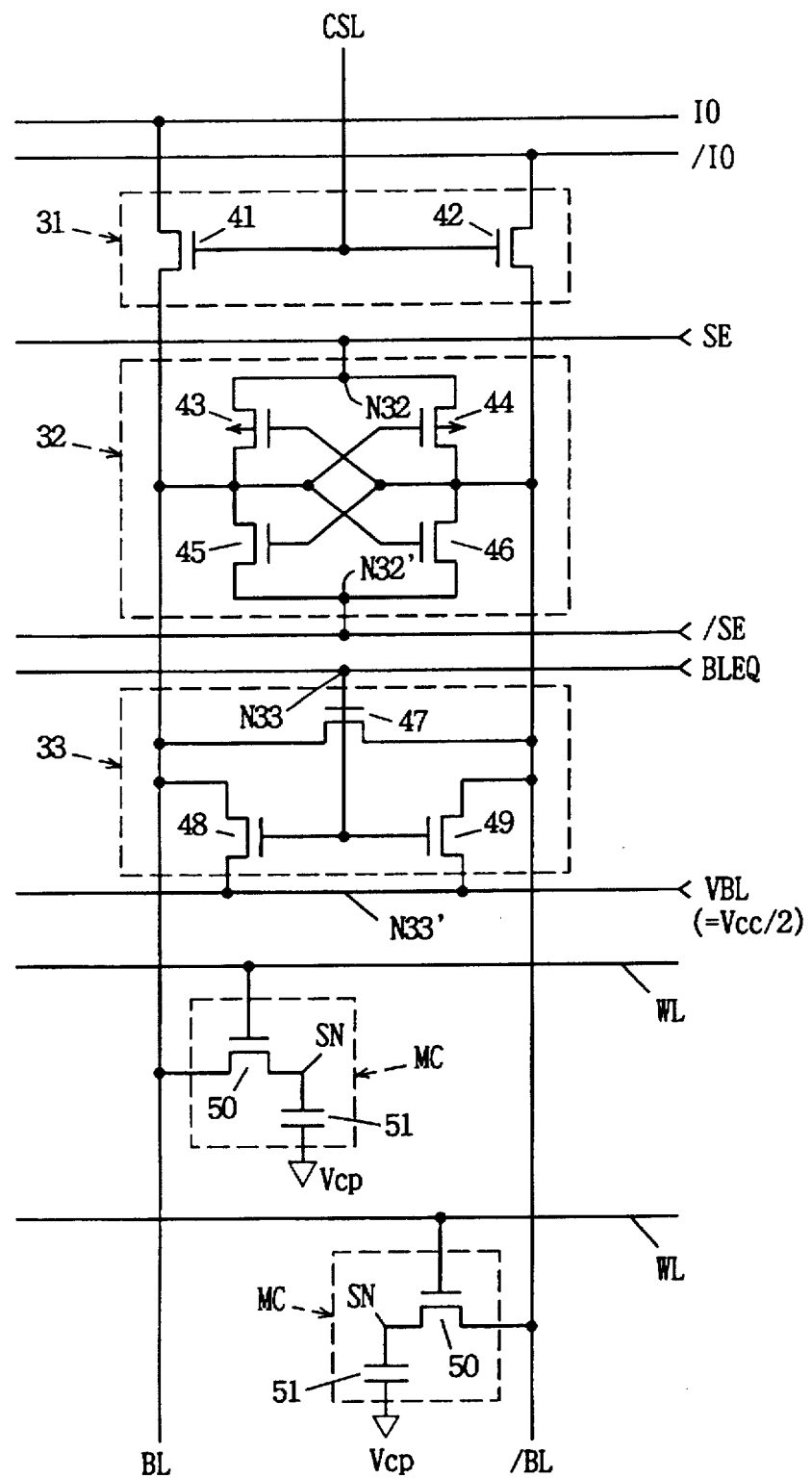
FIG. 6 is a partially omitted circuit diagram showing in detail a structure of one column of the memory mat shown in FIG. 5.
Figure 7:
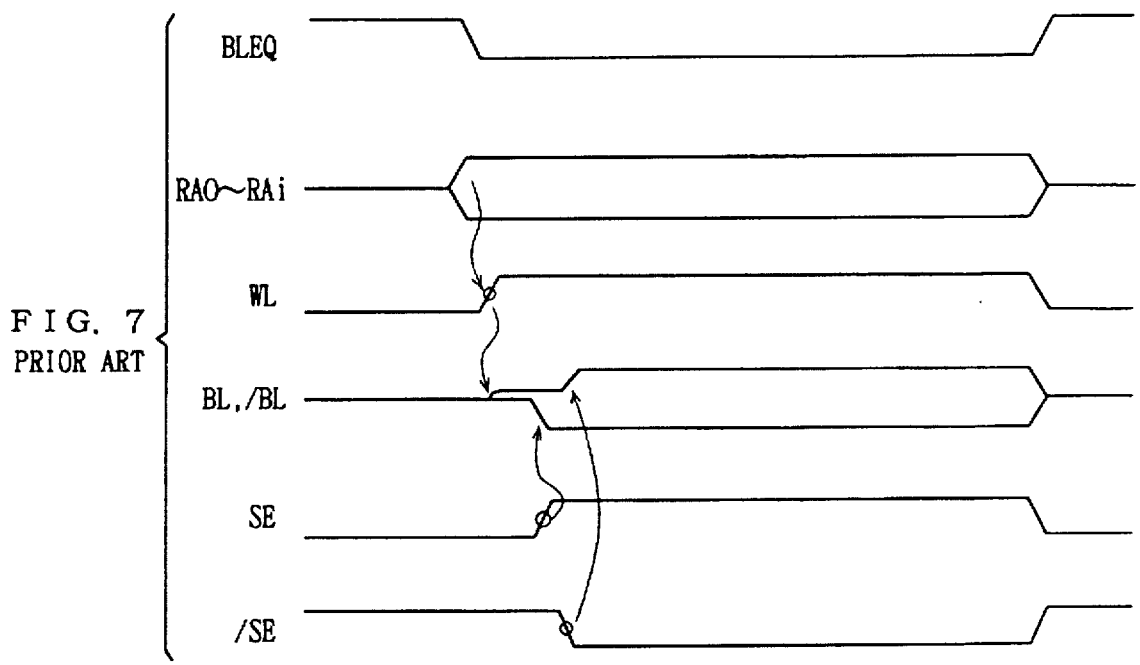
FIG. 7 is a time chart showing reading operation of the DRAM shown in FIG. 4.

Referring to FIG. 1, the DRAM differs from the conventional DRAM in that a switch circuit 1 is newly provided between intermediate potential generating circuit 34 and node N33' of equalizer 33 shown in FIG. 5.

Switching circuit 1 includes three N channel MOS transistors 2 to 4. N channel MOS transistor 2 is connected between a line of power supply potential Vcc and node N33' and receives at its gate a signal φa. N channel MOS transistor 3 is connected between an output node 34a of intermediate potential generating circuit 34 and node N33' and receives at its gate a signal φb. N channel MOS transistor 4 is connected between a line of the ground potential GND and node N33', and receives at its gate a signal φc. Signals φa to φc are output from clock generating circuit 19.

The operation of the DRAM will be described in the following. In normal operation, signals φa and φc attain to the inactive level of "L" level and signal φb attains to the active level of "H", whereby N channel MOS transistors 2 and 4 are rendered non-conductive and N channel MOS transistor 3 is rendered conductive. Consequently, an output potential Vcc/2 from intermediate potential generating circuit 34 is applied to node N33' of equalizer 33. In this case, the operation is completely the same as the conventional DRAM shown in FIG. 5. and data writing and reading are performed in the similar manner as in the conventional DRAM.

Figure 2:
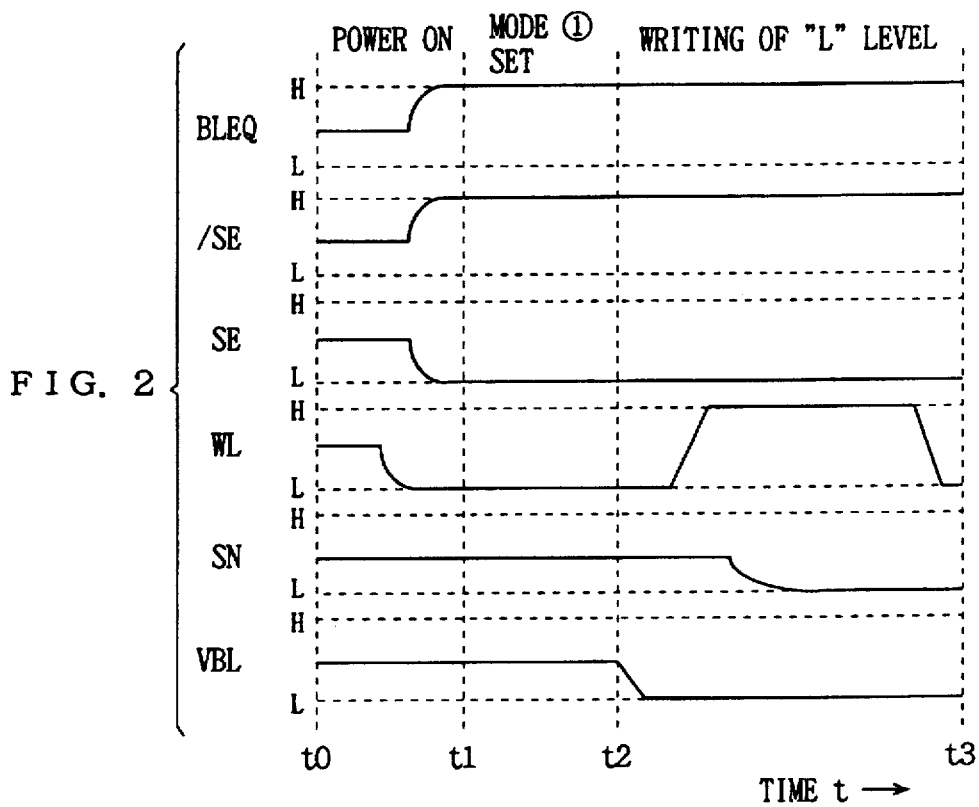
FIG. 2 is a time chart showing a first special write mode ① of the DRAM shown in FIG. 1.

FIG. 2 is a time chart showing an operation of a first special write mode ① for simultaneously writing "L" level to the storage node SN of one row of memory cells MC. When power is turned on at time point t0, DRAM is set to a standby state, signals BLEQ and /SE are fixed at "H" level, and signal SE and word line WL are fixed at "L" level. The storage node SN of each memory cell MC is either at "H" level or "L" level. In switching circuit 1 shown in FIG. 1. of the signals φa to φc, the signal φb only attains to the "H" level, so that N channel MOS transistor 3 is rendered conductive and bit line potential VBL is at Vcc/2.

Between time points t1 to t2, the signals /W, /CAS and /RAS fall to the "L" level at a WCBR (/W and /CAS before /RAS) timing, for example, a super Vcc level is applied to a specific signal terminal and specific address signals A0 to Ai are input, so that the DRAM is set to the first special write mode ①.

In this mode ①, signals BLEQ and /SE are fixed to the "H" level, and signal SE is fixed to the "L" level. Consequently, node N33' of equalizer 33 and all the bit lines BL and /BL are rendered conductive, and sense refresh amplifier 32 is fixed at an inactive state. In the switching circuit 1 shown in FIG. 1, of the signals φa to φc, only the signal φc attains to the "H" level, whereby N channel MOS transistor 4 is rendered conductive, while bit line potential VBL attains to the "L" level, so that all the bit lines BL and /BL attain to the "L" level.

By applying address signals A0 to Ai in this state to maintain the desired word line WL at a raised state of "H" level for a prescribed time period, it becomes possible to write the "L level to the storage nodes SN of all the memory cells MC connected to the word line WL, no matter whether the memory cells are connected to bit line BL or /BL or no matter whether any of the memory cells is replaced by a redundant memory cell MC. For example, even when the memory cell MC connected to word line WL2 and bit line BL' is defective and is replaced by a memory cell MC connected to word line WL2 and bit line /BL1' of redundant memory array 26 in FIG. 5, it is possible to write the "L level to the storage nodes SN of all the memory cells MC connected to the word line WL2 in accordance with the above described method.

Figure 3:
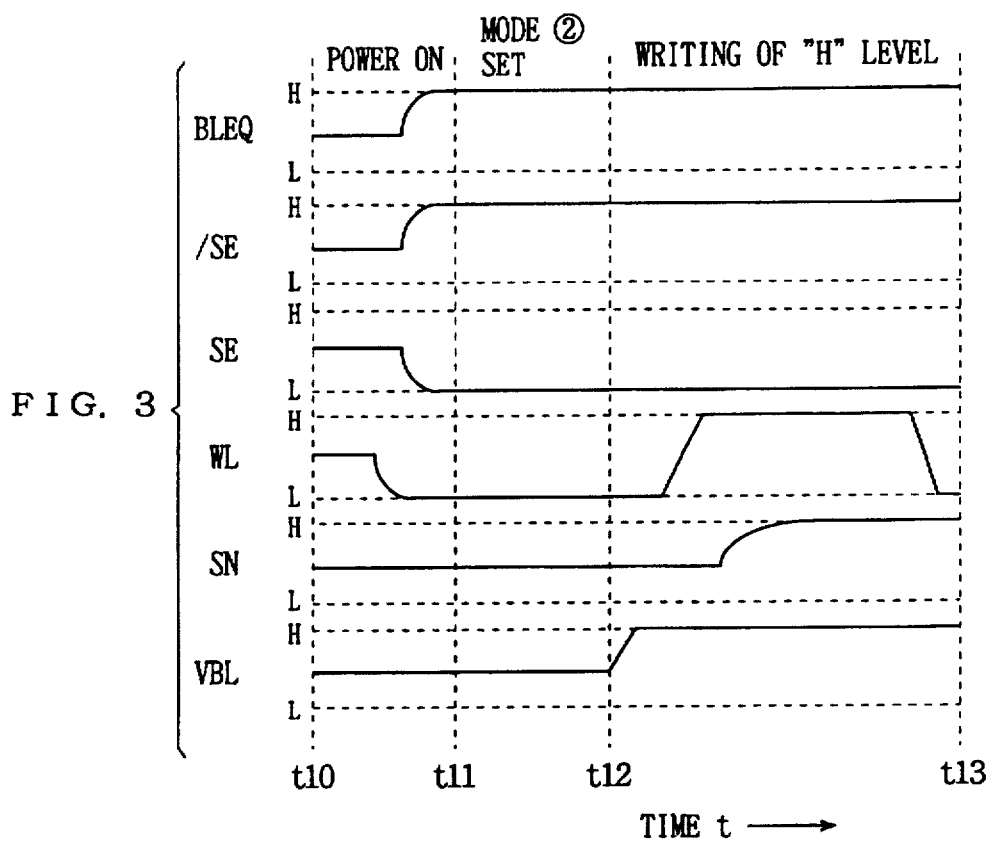
FIG. 3 is a timing chart showing a second special write mode ② of the DRAM shown in FIG. 1.
Figure 4:
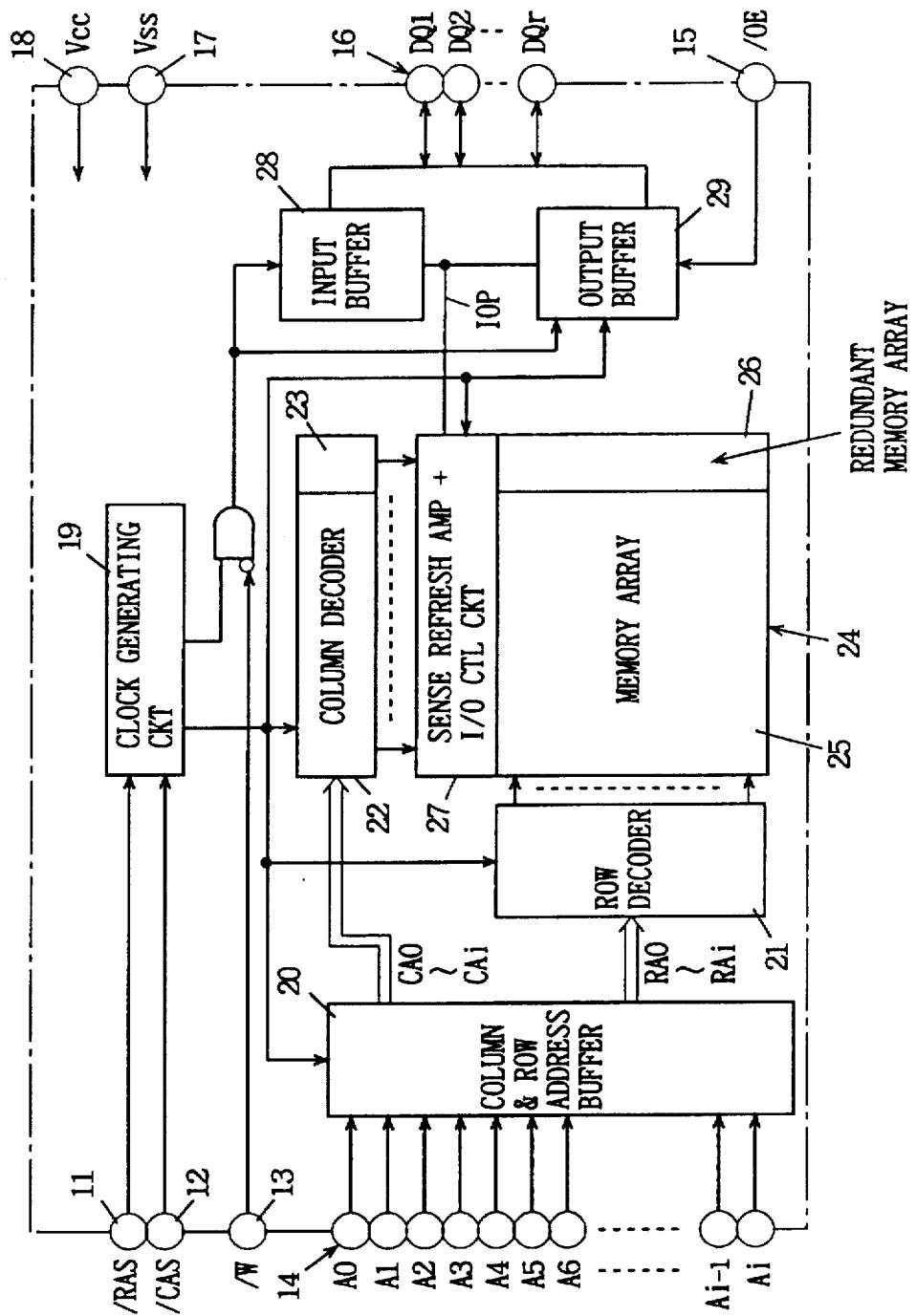
FIG. 4 is a partially omitted circuit block diagram showing a structure of a conventional DRAM.

FIG. 3 is a time chart showing the second special write mode ② for simultaneously writing the "H" level to storage nodes SN of one row of memory cells MC.

When the second special write mode ② is set in the similar manner as the first special write mode ① between time points t11 to t12, signals BLEQ and SE are fixed at the "H" level and signal SE is fixed at "L" level. Consequently, node N33' of equalizer 33 and all the bit lines BL and /BL are rendered conductive, and sense refresh amplifier 32 is fixed at inactive state. In the switching circuit 1 of FIG. 1, of the signals φa to φc, only the signal φa attains to the "H" level, N channel MOS transistor 2 is rendered conductive, bit line potential VBL attains to the "H" level, and all the bit lines BL, /BL attain to the "H" level.

By applying address signals A0 to Ai in this state to maintain a desired word line WL at the raised state of "H" level for a prescribed time period, it becomes possible to write "H" level to the storage nodes SN of all the memory cells connected to the word line WL. For example, when the memory cell MC connected to word line WL2 and bit line BL2 is defective as described above, it is possible to quickly write the "H" level to the storage nodes SN of all the memory cells MC except the row of word line WL2, by successively raising and keeping at "H" level all the word lines WL except the word line WL2.

Details of the test of which necessity has been described in Description of the Background Art will be given in the following. In this case, it is assumed that the memory cell MC connected to word line WL2 and bit line BL2 is defective and is replaced by redundant memory cell MC. First, a tester sets the DRAM to the first special write mode ①, applies address signals A0 to Ai to raise word line WL2 to the "H" level, and writes "L" level to the storage nodes SN of all the memory cells MC which are connected to word line WL2.

Thereafter, the tester sets the DRAM to the second special write mode ②, applies address signals A0 to Ai to successively or simultaneously raise word lines WL1, WL3, . . . other than word line WL2 to the "H" level, and writes "H" level to the storage nodes SN of all the memory cells MC connected to the word lines WL1, WL3, . . . .

Figure 8:
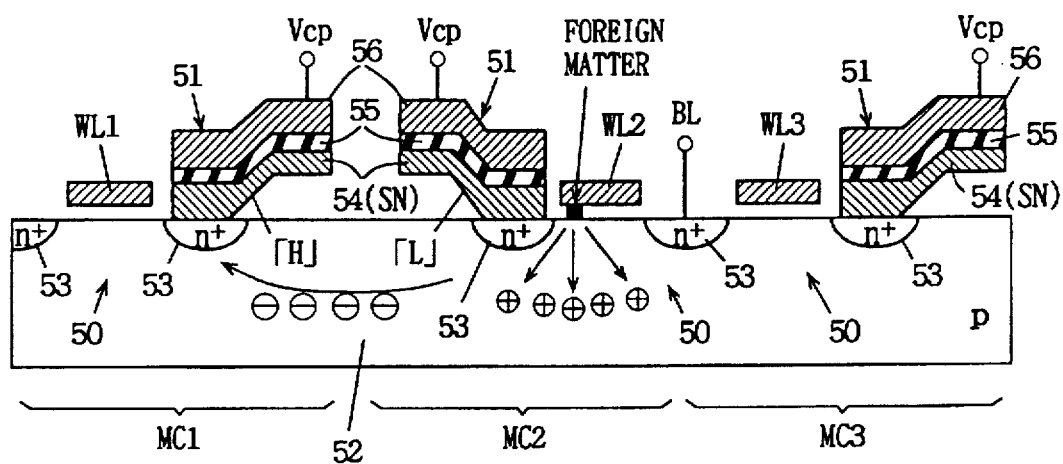
FIG. 8 is a partially omitted cross section showing a problem experienced DRAM shown in FIG. 4.

Thereafter, the tester raises word line WL2 to the "H" level and maintains the "H" level for a prescribed time period. At this time, when the defective memory cell MC connected to word line WL2 and bit line BL2 is in such a defective state as shown in FIG. 8, the storage nodes SN of the memory cells MC therearound, which should be at "H" level, fall to the "L" level. If the defective memory cell MC is not in such a state as shown in FIG. 8, the storage nodes SN of the memory cells MC therearound which should be at the "H" level do not fall to the "L" level. Finally, the tester reads data of memory cells MC near the defective memory cell MC or data from all the memory cells MC, determines whether the levels of storage nodes SN of the memory cells MC have been inverted from the "H" level to the "L" level based on the read data, and if the level has been inverted, determines that the DRAM is defective, and if the level is not inverted, determines that the DRAM is satisfactory.

In this embodiment, the "L" level (or "H" level) is applied to all the bit lines BL, /BL through equalizer 33 and thereafter the word line WL is raised to the "H" level so as to write "L" level (or "H" level) to the storage nodes SN of all the memory cells MC connected to the word line WL. Therefore, no matter whether the memory cell MC is connected to bit line BL or /BL, or no matter whether the memory cell MC is replaced by a redundant memory cell MC, it is possible to simultaneously write the "L" level (or "H" level) to the storage nodes SN of all the memory cells MC connected to the selected word line WL.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a special write mode, comprising:
- a memory array including a plurality of memory cells arranged in a matrix, word lines provided corresponding to respective rows and bit line pairs provided corresponding to respective columns;
- an equalizer provided corresponding to respective bit line pairs for applying a first or a second logic potential to a corresponding bit line pair in response to designation of said special write mode; and write means for setting any of the word lines of said memory array to a selected potential in accordance with a row address, and for simultaneously writing the first or the second logic potential applied from said equalizer to said bit line pair to storage nodes of all the memory cells corresponding to the word line.

2. The semiconductor memory device according to claim 1, wherein said equalizer charges, in response to designation of a read mode, a corresponding bit line pair to a precharge potential, said semiconductor memory device further comprising read means for setting any of the word lines of said memory array to a selected potential in accordance with a row address, and for reading the first or the second logic potential written to the storage node of each of the memory cells corresponding to the word line to the corresponding bit line pair which has been charged to said precharge potential.

3. A method of testing a semiconductor memory device including a memory array including a plurality of memory cells arranged in a matrix, a redundant memory array including at least one column of memory cells for replacing a column of memory cells including a defective memory cell of said memory array, word lines provided corresponding to respective rows of memory cells commonly to said memory array and said redundant memory array, bit line pairs provided corresponding to respective columns of memory cells, and an equalizer provided corresponding to respective bit line pairs for charging corresponding bit line pair, for testing whether a malfunction is caused by a defective memory cell of said memory array replaced by a memory cell of said redundant memory array, comprising the steps of:

applying a first logic potential to each of the bit line pairs through each of the equalizers, keeping a word line corresponding to said defective memory cell at a selected potential for a prescribed time period, and writing the first logic potential to storage node of said defective memory cell;

writing a second logic potential to storage nodes of normal memory cells other than said defective memory cell; and keeping the word line corresponding to said defective memory cell at a selected potential for a prescribed time period, thereafter reading potentials of the storage nodes of said normal memory cells, and determining presence/absence of said malfunction based on the result of reading.

4. The test method for a semiconductor memory device according to claim 3, comprising the step of applying the second logic potential to each of the bit line pairs through each of the equalizers, keeping each of the word lines other than that word line which corresponds to said defective memory cell at a selected potential for a prescribed time period, and writing the second logic potential to the storage nodes of normal memory cells other than said defective memory cell.

* * * * *